(12) United States Patent
Lee et al.

(10) Patent No.: US 8,999,201 B2
(45) Date of Patent: Apr. 7, 2015

(54) GRAPHENE SUBSTITUTED WITH BORON AND NITROGEN, METHOD OF FABRICATING THE SAME, AND TRANSISTOR HAVING THE SAME

(71) Applicant: Samsung Electronics Co., Ltd., Suwon-Si, Gyeonggi-Do (KR)

(72) Inventors: Sung-hoon Lee, Hwaseong-si (KR); Sun-ae Seo, Hwaseong-si (KR); Yun-sung Woo, Suwon-si (KR); Hyun-jong Chung, Hwaseong-si (KR); Jin-seong Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/162,397

(22) Filed: Jan. 23, 2014

(65) Prior Publication Data

US 2014/0131626 A1 May 15, 2014

Related U.S. Application Data

(62) Division of application No. 13/064,896, filed on Apr. 25, 2011, now Pat. No. 8,664,439.

(30) Foreign Application Priority Data

Jun. 21, 2010 (KR) .................. 10-2010-0058604

(51) Int. Cl.
| | |
|---|---|
| *H01L 29/16* | (2006.01) |
| *B82Y 30/00* | (2011.01) |
| *B82Y 40/00* | (2011.01) |
| *C01B 31/04* | (2006.01) |
| *H01L 29/778* | (2006.01) |
| *H01L 29/786* | (2006.01) |

(52) U.S. Cl.
CPC ............ *H01L 29/1606* (2013.01); *B82Y 30/00* (2013.01); *B82Y 40/00* (2013.01); *C01B 31/0453* (2013.01); *H01L 29/7781* (2013.01); *H01L 29/78684* (2013.01)

(58) Field of Classification Search
CPC .................................................. H01L 29/1606
USPC ........................................................ 252/500
See application file for complete search history.

(56) References Cited

U.S. PATENT DOCUMENTS

| | | |
|---|---|---|
| 2005/0271574 A1 | 12/2005 | Jang et al. |
| 2009/0047520 A1 | 2/2009 | Lee et al. |
| 2009/0169919 A1 | 7/2009 | Garcia et al. |
| 2009/0174435 A1 | 7/2009 | Stan et al. |
| 2010/0055464 A1 | 3/2010 | Sung |
| 2010/0102292 A1* | 4/2010 | Hiura et al. ................ 257/9 |

FOREIGN PATENT DOCUMENTS

| | | |
|---|---|---|
| CN | 101708837 A | 5/2010 |
| KR | 20080100430 A | 11/2008 |
| KR | 20090124330 A | 12/2009 |
| WO | WO-2008/108383 A1 | 9/2008 |

OTHER PUBLICATIONS

Ci, Lijie et al. "Atomic layers of hybridized boron nitride and graphene domains." *Nature Materials*, vol. 9: May 2010, pp. 430-435; supplementary information pp. 1-10.
Chinese Office Action dated Apr. 15, 2014 issued in corresponding Chinese Application No. 201110164676.0 (with English translation).
L.S. Panchakarla, A. Govindaraj, C.N.R. Rao, "Boron—and Nitrogen—doped carbon nanotubes and graphene", Inorganica Chimica Acta 363 (2010) 4163-4174.
Di Wu, Zhiming Yu, Jin Xiao, Fangping Ouyang, "The chemical modification of graphene antidot lattices", Physica E 43 (2010) 33-39.
Nan Li, Zhiyong Wang, Keke Zhao, Zujin Shi, Zhennan Gu, Shukun Xu, "Large scale synthesis of N—doped multi-layered graphene sheets by simple arc-discharge method", Carbon 48 (2010) 255-259.
Maria Velinova, Vihar Georgiev, Tsanka Todorova, Galia Madjarova, Anela Ivanova, Alia Tadjer, "Boron—nitrogen—and boron—substituted anthracenes and -phenanthrenes as models for doped carbon-based materials", Journal of Molecular Structure: Theochem 955 (2010) 97-108.
Japanese Office Action dated Nov. 11, 2014 issued in corresponding Japanese Application No. 2011-133050 (with English translation).

\* cited by examiner

*Primary Examiner* — Fereydoun G Sajjadi
*Assistant Examiner* — Kofi Adzamli
(74) *Attorney, Agent, or Firm* — Harness, Dickey & Pierce, P.L.C.

(57) ABSTRACT

Graphene, a method of fabricating the same, and a transistor having the graphene are provided, the graphene includes a structure of carbon (C) atoms partially substituted with boron (B) atoms and nitrogen (N) atoms. The graphene has a band gap. The graphene substituted with boron and nitrogen may be used as a channel of a field effect transistor. The graphene may be formed by performing chemical vapor deposition (CVD) method using borazine or ammonia borane as a boron nitride (B-N) precursor.

5 Claims, 4 Drawing Sheets

GRAPHENE SUBSTITUTED WITH BORON AND NITROGEN, METHOD OF FABRICATING THE SAME, AND TRANSISTOR HAVING THE SAME

CROSS-REFERENCE TO RELATED APPLICATIONS

This application claims the benefit of Korean Patent Application No. 10-2010-0058604, filed on Jun. 21, 2010, in the Korean Intellectual Property Office, the disclosure of which is incorporated herein in its entirety by reference.

BACKGROUND

1. Field

Example embodiments relate to graphene substituted with boron and nitrogen, a method of fabricating the same and a transistor having the same.

2. Description of the Related Art

Graphene is a hexagonal single-layer structure formed of carbon (C) atoms. Graphene exhibits excellent chemical stability, and has a semi-metal characteristic. The semi-metal characteristic is due to a conduction band and a valance band overlapping each other at only one point (i.e., a Dirac point). Furthermore, graphene has 2-dimensional ballistic transport characteristic. Thus, a mobility of electrons in graphene is very high.

Because graphene is a zero-gap semiconductor, a field-effect transistor, in which graphene is used as a channel, exhibits a very large off-current and a very small ON-OFF ratio. Thus, it is difficult to apply graphene to a field effect transistor.

To use graphene as a channel of a field effect transistor, a band gap should be formed in graphene. If a channel width is below 10 nm and edges are formed in the shape of an arm chair, a band gap is formed due to a size effect.

However, it is difficult to pattern a channel width below 10 nm, and more particularly, it is difficult to pattern edges in the shape of an arm chair.

SUMMARY

Example embodiments relate to graphene substituted with boron and nitrogen, a method of fabricating the same and a transistor having the same.

Provided are graphene, which is substituted with boron and nitrogen to form a band gap, and a transistor having the same.

Additional aspects will be set forth in part in the description which follows and, in part, will be apparent from the description, or may be learned by practice of the presented embodiments.

According to example embodiments, there is provided graphene including a structure of carbon (C) atoms partially substituted with boron (B) atoms and nitrogen (N) atoms, wherein the graphene has a band gap.

The B atoms and the N atoms may substitute from about 1% to about 20% of the C atoms of the graphene.

A difference between densities of the B atoms and the N atoms is below $10^{13}$ cm$^{-2}$.

The C atoms of the graphene are substituted with the B atoms and the N atoms substantially at the same ratio.

According to example embodiments, there is provided a transistor including channel formed of graphene, wherein a band gap is formed in the graphene by partially substituting carbon (C) atoms with boron (B) atoms and nitrogen (N) atoms.

According to example embodiments, there is provided a method of fabricating graphene by performing a chemical vapor deposition (CVD) method using borazine or ammonia borane as a boron nitride (B-N) precursor.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
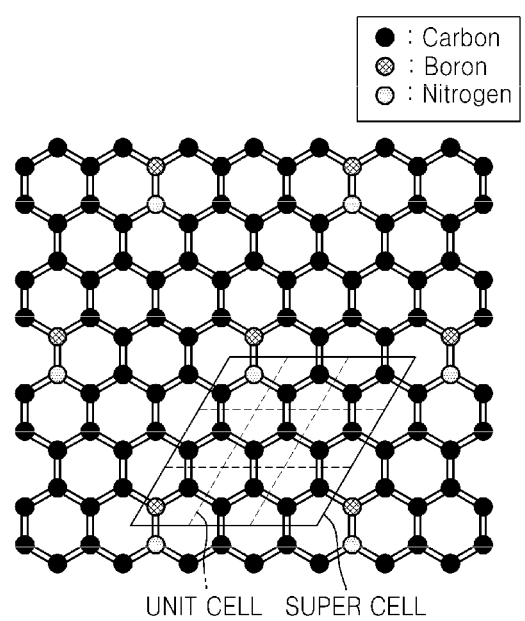
FIG. 1 is a schematic diagram of graphene in which a band gap is formed according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises,"

"comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to graphene substituted with boron and nitrogen, a method of fabricating the same and a transistor having the same.

Because two electronic states having the same energy potential exist at the Fermi level of graphene, graphene has a zero band gap. The reason that two electronic states having the same energy potential exist at the Fermi level of graphene is that two electrons within a unit cell of graphene form a sublattice symmetry. On the contrary, hexagonal boron nitride with a broken sublattice symmetry exhibits a relatively high band gap at around 5.5 eV.

To form a band gap in graphene, it is necessary to break the sublattice symmetry of graphene. In this regard, carbon (C) atoms in graphene may be asymmetrically substituted with an impurity, or atoms other than carbon. For example, a band gap may be formed in graphene by substituting C atoms with boron (B) atoms. To increase a band gap of graphene, it is necessary to significantly increase the density of B. Alternatively, C atoms in graphene may also be substituted with nitrogen (N) atoms or other atoms, instead of B atoms.

When C atoms of graphene are substituted with B atoms or N atoms, extra electrons or holes are formed in graphene. Therefore, if graphene having a band gap is used as a channel of a field effect transistor, an excessive gate voltage is necessary to form carrier depletion.

FIG. 1 is a schematic diagram of graphene in which a band gap is formed according to example embodiments.

Referring to FIG. 1, a dimer consisting of B and N is formed in two unit cells.

In the arrangement shown in FIG. 1, a super cell consists of 3×3 unit cells and is substituted by a pair of B-N dimer. The super cell may be substituted by a B atom and a N atom, each part of different B-N dimers. One super cell includes nine unit cells, and each of the unit cells has two C atom positions, and thus there are 2/18 atoms of impurities. In other words, about 11% of C atoms are substituted with impurities.

Figure 2:
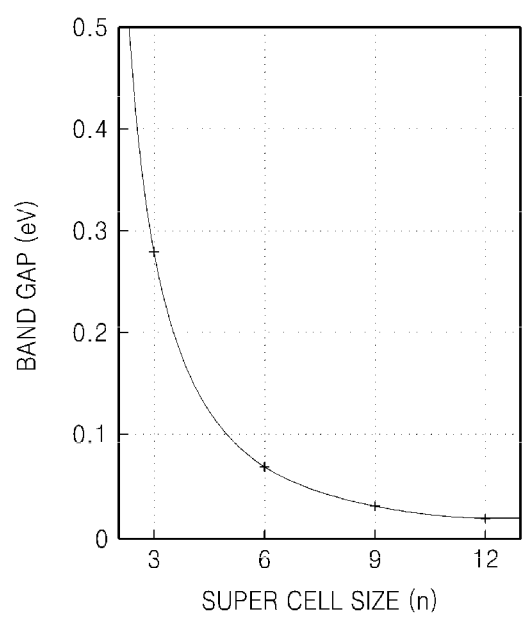
FIG. 2 is a graph showing a result of calculating a band gap of graphene substituted with B and N according to density function theory.

FIG. 2 is a graph showing a result of calculating a band gap of graphene substituted with B and N according to density function theory.

In FIG. 2, n indicates a square root of a number of unit cells included in a super cell. For example, a value of n with respect to the arrangement shown in FIG. 1 is 3.

Referring to FIG. 2, two C atoms are substituted by a pair of a B atom and an N atom, respectively. As the size n of a super cell increases, a band gap of graphene is reduced. When n is 2, a super cell includes 25 atomic % of impurities, and thus unique characteristics of graphene may be deteriorated. When n exceeds 10, a super cell includes 1 atomic % or below of impurities and a band gap of graphene is reduced to about 0.05 eV, and thus the graphene exhibits a small ON/OFF ratio when the graphene is used as a channel of a field effect transistor. Therefore, a super cell may have a value of n from about 3 to about 10, and a band gap of graphene may be from about 0.05 eV to about 0.3 eV.

Sufficient gate controllability of a field effect transistor using graphene as a channel may be secured by substitution-doping B and N into graphene at similar densities. For a gate control using a general gate voltage, it is necessary for a difference between the doping densities of B and N in graphene, which is doped with dimers of B and N, to be below $10^{13}$ cm$^{-2}$. If a difference between the doping densities of B and N in graphene exceeds $10^{13}$ cm$^{-2}$, a larger gate voltage becomes necessary.

Furthermore, in a field effect transistor using graphene as a channel, it is necessary for the doping densities of B and N to be above 1 atomic % ($10^{13}$ cm$^{-2}$) in order to form to suitable band gap and to be below 20 atomic % in order to maintain the unique characteristics of the graphene.

To fabricate graphene substituted with B and N, when graphene is formed by using chemical vapor deposition (CVD) method, a B source (e.g., $BCl_3$), and an N source (e.g., $N_2$ or $NH_3$) are supplied into a CVD chamber together with a C containing gas, which is a C precursor (e.g., $C_2H_4$, $CH_4$, etc.). A band gap of graphene may be controlled by adjusting the concentrations of a B precursor and an N precursor.

Compared to other III-V atom pairs, a B-N pair has a bond length and a bond strength similar to those of a C structure of graphene, and thus string sp2 sigma bonding and $p_z$ pi bonding of graphene may be maintained even after substitution with B-N.

Figure 3:
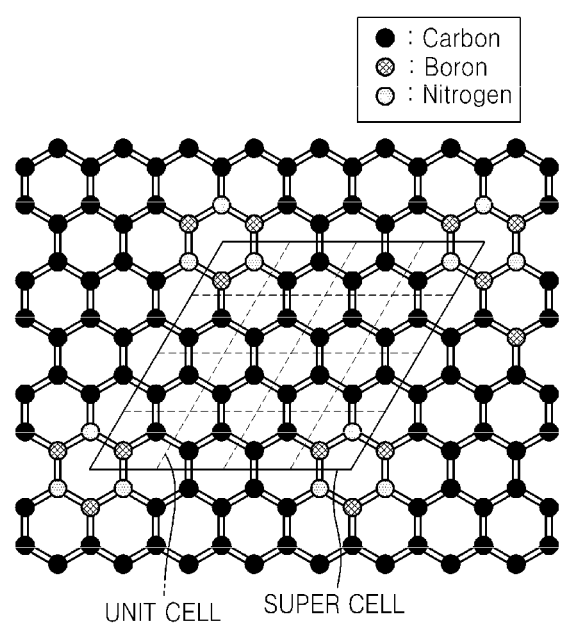
FIG. 3 is a schematic diagram of graphene in which a band gap is formed according to example embodiments.

FIG. 3 is a schematic diagram of graphene in which a band gap is formed according to example embodiments.

Referring to FIG. 3, a hexagonal boron nitride substitutes a hexagonal C structure. A super cell consists of 4×4 unit cells, and 3 atoms of B and 3 atoms of N are arranged in one super cell. Because one super cell consists of 16 unit cells and each of the unit cells has two atomic positions, there are 6/32 atoms of impurities. In other words, about 19% of C atoms are substituted with impurities.

Figure 4:
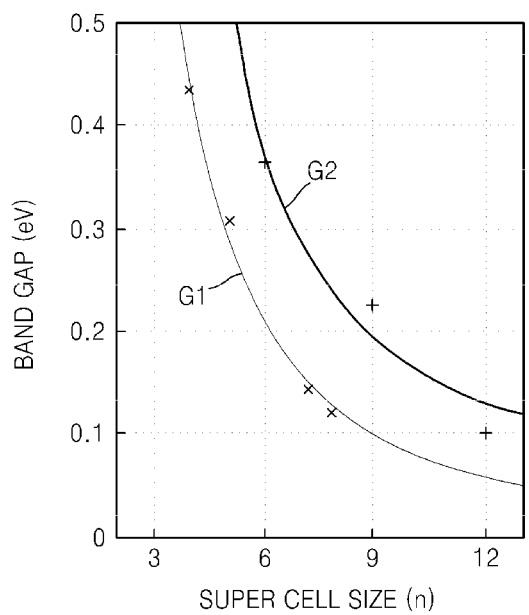
FIG. 4 is a graph showing a result of calculating a band gap of graphene substituted with hexagonal boron nitride according to the density function theory.

FIG. 4 is a graph showing a result of calculating a band gap of graphene substituted with hexagonal boron nitride according to the density function theory.

In FIG. 4, n indicates a square root of a number of unit cells included in a super cell. For example, n with respect to the arrangement shown in FIG. 3 is 4.

Referring to FIG. 4, three B atoms and three N atoms substitute C atoms in a super cell. As the size n of a super cell increases, a band gap of graphene is reduced. In FIG. 4, band gap curves of graphene are indicated by two curves G1 and G2. The curve G2 indicates the case in which N of a super cell is a multiple of 3, and the curve G1 indicates the case in which N of a super cells is not a multiple of 3. As shown in FIG. 4, a band gap in the case where n is a multiple of 3 is greater than a band gap in the case where a value of N is not a multiple of 3.

When n is 3, a super cell includes 33 atomic % of impurities, and thus unique characteristics of graphene may be deteriorated. When N exceeds 18, a super cell includes less than 1 atomic % of impurities and a band gap of graphene may be too low to use the graphene as a channel of a field effect transistor. Therefore, a super cell may have a value of N from about 4 to about 17, and a band gap of graphene may be from about 0.05 eV to about 0.45 eV.

To fabricate graphene substituted with boron nitride, when graphene is formed by using CVD method, a B source (e.g., $BCl_3$), and an N source (e.g., $N_2$ or $NH_3$) are supplied into a CVD chamber together with a C containing gas, which is a C precursor (e.g., $C_2H_4$, $CH_4$, etc.).

Borazine having a $(HB)_3$-$(NH)_3$ hexagonal structure may be used as a B and N precursor. In case of using borazine, it is easy to supply B and N at a 1:1 ratio. Even if the structure of borazine is broken when graphene is grown by using CVD method at a high temperature, stoichiometry is maintained. B atoms and N atoms are respectively combined to other N atoms and B atoms relatively easy as compared to C atoms. When the graphene is substituted with the borazine, the hexagonal structure of the borazine may be maintained, and thus, the graphene substituted with the borazine may be very stable energy-wise.

A band gap of graphene may be easily controlled by adjusting the amount of borazine, which is a B-N precursor.

Alternatively, ammonia borane, which is a precursor containing B atoms and N atoms at a 1:1 ratio, may be used instead of borazine. The chemical formula of ammonia borane is $BH_3$-$NH_3$.

Figure 5:
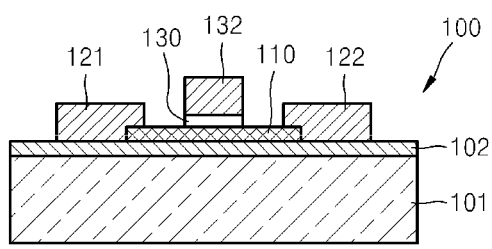
FIG. 5 is a sectional view of a field effect transistor including graphene according to example embodiments.

FIG. 5 is a sectional view of a field effect transistor including graphene according to example embodiments.

Referring to FIG. 5, a graphene channel 110, a source electrode 121, and a drain electrode 122 are formed on a substrate 101. The substrate 101 may be a silicon substrate. An insulation film 102 is formed between the substrate 101 and the graphene channel 110, the source electrode 121 and the drain electrode 122. The insulation film 102 may be formed of silicon oxide. The source electrode 121 and the drain electrode 122 may be formed of a general metal (e.g., aluminum (Al), molybdenum (Mo) or the like).

The graphene channel 110 may be formed of graphene substituted with B and N. B atoms and N atoms may substitute from about 1% to about 20% of C atoms of graphene. A difference between substitution densities of B and N in graphene may be below $10^{13}$ $cm^{-2}$. If a difference between substitution densities of B and N of graphene exceeds $10^{13}$ $cm^{-2}$, a threshold voltage for controlling a gate increases.

A gate oxide 130 and a gate electrode 132 are sequentially stacked on the graphene channel 110. The gate electrode 132 may be formed of aluminum (Al) or poly-silicon. The gate oxide 130 may be formed of silicon oxide.

Although FIG. 5 shows that a field effect transistor using graphene substituted with B and N as a channel has a top gate structure, example embodiments are not limited thereto. For example, a field effect transistor using graphene substituted with B and N as a channel may have a bottom gate structure, where detailed descriptions thereof will be omitted.

Graphene according to example embodiments has a band gap and may function as a channel of a field effect transistor.

During fabrication of graphene, the graphene may be substituted with B atoms and N atoms at the same ratio by using borazine or ammonia borane as a precursor.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A transistor, comprising:
a channel formed of graphene,
wherein the graphene includes a structure of carbon (C) atoms partially substituted with boron (B) atoms and nitrogen (N) atoms, and
the graphene has a band gap.

2. The transistor of claim 1, wherein the B atoms and the N atoms substitute from about 1% to about 20of the C atoms of the graphene.

3. The transistor of claim 1, wherein a difference between densities of the B atoms and the. N atoms is below $10^{13}$ $cm^{-2}$.

4. The transistor of claim 3, wherein the B atoms and the N atoms are present in the graphene at substantially the same ratio.

5. The transistor of claim 4, wherein the C atoms of the graphene are partially substituted with at least one dimer having one of the B atoms and one of the N atoms or at least one hexagonal structure having three of the B atoms and three of the N atoms.

* * * * *